United States Patent
Takacs et al.

(10) Patent No.: US 9,676,173 B2
(45) Date of Patent: Jun. 13, 2017

(54) PROCESS FOR THE TRANSFER OF AT LEAST A PORTION OF A COMPOSITE FILM ONTO A FLEXIBLE POLYMER MEMBRANE

(71) Applicant: Commissariat a l'Energie Atomique et aux Energies Alternatives, Paris (FR)

(72) Inventors: Helene Takacs, Grenoble (FR); Bernard Viala, Sassenage (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/955,271

(22) Filed: Dec. 1, 2015

(65) Prior Publication Data

US 2016/0159056 A1    Jun. 9, 2016

(30) Foreign Application Priority Data

Dec. 4, 2014  (FR) ...................... 14 61940

(51) Int. Cl.
- *C03C 25/68* (2006.01)
- *B32B 37/00* (2006.01)

(Continued)

(52) U.S. Cl.
CPC ............ *B32B 37/025* (2013.01); *B32B 37/06* (2013.01); *B81C 1/0088* (2013.01);
(Continued)

(58) Field of Classification Search
CPC .......... B81C 1/0088; B81C 2201/0191; H01L 21/0272; H01L 21/0331; H01L 31/1892
(Continued)

(56) References Cited

U.S. PATENT DOCUMENTS 6,951,173 B1 * 10/2005 Meissl ................. B29C 43/003
101/130
2004/0134883 A1 * 7/2004 Fujihira ................ B82Y 10/00
216/40

(Continued)

FOREIGN PATENT DOCUMENTS

WO     WO 2005/004205 A2     1/2005
WO     WO 2005/004205 A3     1/2005

OTHER PUBLICATIONS

D.R. Hines, et al., "Transfer printing methods for the fabrication of flexible organic electronics" Journal of Applied Physics, vol. 101, XP12097480, 2007, pp. 024503-1 024503-9.

(Continued)

*Primary Examiner* — Binh X Tran
(74) *Attorney, Agent, or Firm* — Oblon, McClelland, Maier & Neustadt, L.L.P.

(57) ABSTRACT

Process for the transfer of a composite film onto a flexible polymer membrane in which the composite film comprises a matrix made of thermoplastic polymer and particles. This process comprises the following operations:
1) the movement of the membrane into a position in which it closes up, in a way leaktight to a fluid, an opening of a reservoir and a first zone of its front face is directly in contact on an external face of the composite film,
2) the heating of the composite film, so as to soften it, then
3) when the composite film is softened, a fluid inside the reservoir uniformly compresses the first zone against the external face of the composite film in order to adhesively bond this first zone to this external face, then
4) the movement of the membrane to a retracted position in order to separate, from the rigid substrate, the portion of the composite film adhesively bonded to the first zone.

15 Claims, 2 Drawing Sheets

(51) Int. Cl.
B32B 37/06 (2006.01)
H01L 21/027 (2006.01)
H01L 31/18 (2006.01)
B81C 1/00 (2006.01)
H01L 21/033 (2006.01)
G03F 7/00 (2006.01)

(52) U.S. Cl.
CPC ........ G03F 7/0002 (2013.01); H01L 21/0272 (2013.01); H01L 21/0331 (2013.01); H01L 31/1892 (2013.01); B32B 2309/105 (2013.01)

(58) Field of Classification Search
USPC ........................................ 216/36, 40, 52, 54
See application file for complete search history.

(56) References Cited

U.S. PATENT DOCUMENTS

| | | | | |
|---|---|---|---|---|
| 2004/0146792 | A1* | 7/2004 | Nimmakayala | B29C 59/02 430/22 |
| 2005/0199584 | A1* | 9/2005 | Nuzzo | B81C 1/0046 216/54 |
| 2008/0229948 | A1 | 9/2008 | Washiya et al. | |
| 2011/0068083 | A1* | 3/2011 | Kobayashi | B82Y 10/00 216/54 |
| 2011/0266255 | A1* | 11/2011 | Wuister | B82Y 10/00 216/40 |
| 2012/0228601 | A1* | 9/2012 | Hiyama | G02B 5/0231 257/40 |
| 2014/0102010 | A1* | 4/2014 | Allison | B24B 37/013 51/296 |
| 2014/0127976 | A1* | 5/2014 | Duescher | B24B 37/30 451/41 |
| 2014/0246566 | A1* | 9/2014 | Maruyama | G02B 3/0031 250/208.1 |
| 2014/0305904 | A1* | 10/2014 | Lan | H01L 33/0095 216/40 |

OTHER PUBLICATIONS

Hai Li, et al., "A Universal, Rapid Method for Clean Transfer of Nanostructures onto Various Substrates" http://www.ntu.edu.sg/home/hzhang (This document is the Submitted Manuscript version of a Published Work that appeared in final form in ACS Nano, copyright ©[2014] American Chemical Society after peer review and technical editing by the publisher. To access the final edited and published work see http://pubs.acs.org.ezlibproxy1.ntu.edu sg./doi/abs/10.1021/nn501779 ), 37 pages.

Hai Li, et al., "A Universal, Rapid Method for Clean Transfer of Nanostructures onto Various Substrates" ACSNANO, vol. 8, No. 7, XP55205261, 2014, pp. 6563-6570.

Matthew A. Meitl, et al., "Transfer printing by kinetic control of adhesion to an elastomeric stamp" Letters, vol. 5, 2006, pp. 33-36.

Elizabeth J. Smythe, et al., "A Technique to Transfer Metallic Nanoscale Patterns to Small and Non-Planar Surfaces" ACSNANO, vol. 3, 2009, pp. 59-65.

* cited by examiner

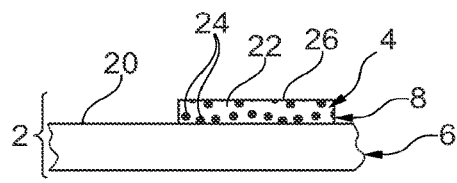
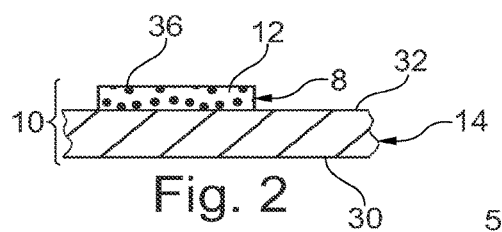
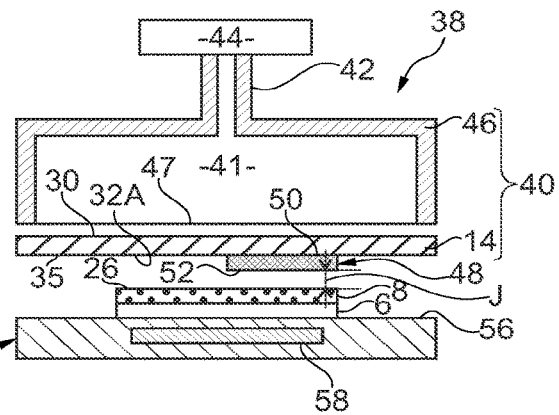
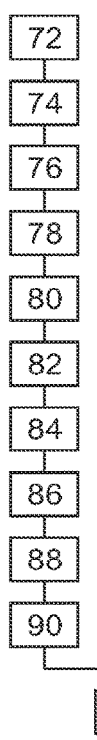
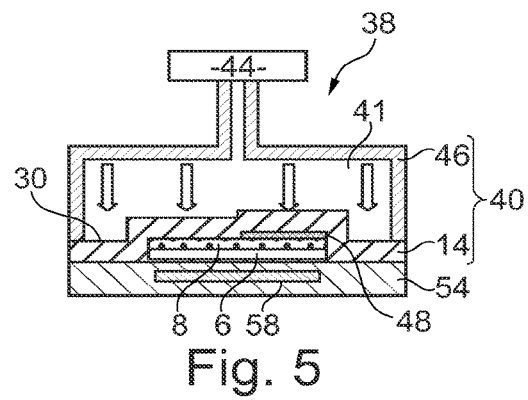
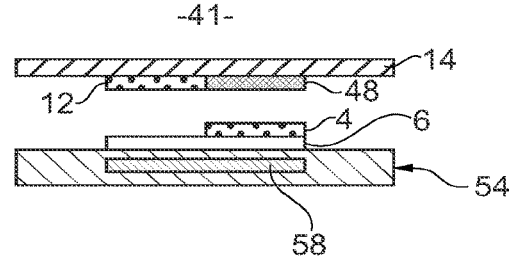

PROCESS FOR THE TRANSFER OF AT LEAST A PORTION OF A COMPOSITE FILM ONTO A FLEXIBLE POLYMER MEMBRANE

The invention relates to a process for the transfer of at least a portion of a composite film onto a flexible polymer membrane. Another subject-matter of the invention is processes for the manufacture of a component using this transfer process.

A composite film is a film which comprises a matrix made of thermoplastic polymer inside which are dispersed particles conferring, on this composite film, physical properties essential for the operation of a component, the exodiameter of the particles being between 1 nm and 100 µm and the volume of the particles inside the composite film representing more than 1% and advantageously more than 10% of the volume of this composite film. Subsequently, the term "nanoparticles" is used when these particles, dispersed inside the matrix, have an exodiameter of between 1 nm and 1 µm.

Known processes for the transfer of a composite film onto a flexible membrane comprise:

α) the deposition of the composite film directly on a rigid substrate made of a material other than a polymer and having a thickness strictly greater than the thickness of the film, the composite film then exhibiting an external face turned the opposite way from the rigid substrate, then β) the transfer of at least a portion of the composite film deposited on the rigid substrate to the membrane by stamping.

For example, such a process is described in the following paper: H. Li et al., "*Universal, Rapid Method for Clean Transfer of Nanostructures onto Various Substrates*", ACS Nano, 2014.

The known processes use a solution or a drop of water to bring about the detachment of the composite film from the rigid substrate.

The following are also known from the state of the art:
Hines D et al.: "Transfer printing methods for the fabrication of flexible organic electronics", Journal of Applied Physics, American Institute of Physics, US, Vol. 101, No. 2, Jan. 16, 2007,
US2008/229948A1,
WO2005/004205A2.

The invention is targeted at providing a transfer process which is simpler to carry out. It thus has as subject-matter such a transfer process in accordance with Claim 1.

The above process makes use of the fact that, when the composite film is heated above the glass transition temperature, the adhesive force of the composite film on a polymer increases, whereas, at the same time, the adhesive force of this composite film on a material which is not a polymer decreases. Thus, on conclusion of the heating and of the compression of the membrane, the adhesive force of the film on the first zone is greater than the adhesive force of the film on the rigid substrate. It is then possible to easily transfer at least a portion of the composite film onto the flexible membrane. In particular, it is not necessary to resort to additional means for bringing about the separation between the composite film and the rigid substrate. For example, it is not necessary to use a drop or to dip the composite film in a solution in order to bring about the separation. In the above process, a simple movement of the membrane to its retracted position is sufficient to tear off, from the rigid substrate, the desired portion of the composite film.

The above process also exhibits the additional advantage that it makes possible a simple transfer of a portion of the composite film onto numerous membranes made of different polymers. This is because the only constraint imposed on the choice of the material of the membrane is that it be made of polymer. It is thus possible to transfer the portion of the composite film onto membranes made of materials other than PDMS (polydimethylsiloxane).

Finally, in the above process, since the composite film is softened at the moment when it is brought into contact with the membrane, it is important for the first zone to be strictly parallel to the external face of the composite film during the compression operation. This is because the slightest defect in alignment is immediately reflected by a decrease in the thickness of the composite film at a location as the film is soft at that moment. Moreover, if nothing is done, this uncontrolled variation in the thickness of the composite film endures even after the composite film has been cooled. In point of fact, it is very difficult to obtain such an alignment with a conventional microstamping process in which the membrane is adhesively bonded to a hard substrate. In the above process, this difficulty is solved by compressing the membrane on the external face of the composite film using a fluid. This guarantees that the pressure exerted by the membrane on the external face of the composite film is perfectly uniform and thus that the first zone remains parallel to the external face during the compression. Thus, the above process does not create uncontrolled variations in the thickness of the composite film.

Finally, after having devised the above process, the Applicants have discovered that the machine necessary in order to compress the front face of the membrane against the external face of the composite film is similar to the microstamping machine described in Application US2003/0159608. On this subject, the Applicants emphasize that Application US2003/0159608 describes a machine designed to structure a mask on a rigid substrate in order to carry out lithography. In US2003/0159608, it is absolutely necessary to prevent a portion of the mask being transferred onto the membrane as this would destroy the structure of the mask. Thus, US2003/0159608 does not disclose a machine for transferring a composite film onto a flexible membrane and does not even suggest that, with a few adaptations, this machine might be used to do this. Furthermore, Application US2003/0159608 does not relate to composite films but solely to a resin mask devoid of particles. Under these conditions, a person skilled in the art seeking to improve the known processes for the transfer of a composite film onto a flexible polymer membrane could not, without an inventive effort, find this document. Furthermore, before a person skilled in the art starts to look for a process which makes it possible to use the flexible membrane as a stamp, it would be already necessary for him to know that there was an advantage in doing this. In point of fact, actually, the idea of using the flexible membrane directly as a stamp only forms part of the personal knowledge of the inventors and not part of the knowledge of a person skilled in the art.

The embodiments of this transfer process can comprise one or more of the characteristics of the dependent claims.

These embodiments of the transfer process additionally exhibit the following advantages:

The use of a stamp for covering a second zone of the front face of the membrane makes it possible to transfer only a portion of the composite film onto the membrane and, at the same time, to cut up the composite film.

Placing the stamp in front of a cavity of the rigid substrate makes it possible to simply fill this cavity with the material of the composite film and also to etch the composite film around this cavity.

Another subject-matter of the invention is a process for the manufacture, on a flexible polymer membrane, of a component comprising a composite film. This manufacturing process uses the claimed transfer process.

In the above process, it is directly the flexible membrane which is used as a stamp for withdrawing at least a worthwhile portion of the composite film. Thus, in the above process, in contrast to the known processes, it is not necessary to use an intermediate stamp in order:
to withdraw the desired portion of the composite film, then
to transport it to the flexible membrane, then
to deposit it on this flexible membrane.

The fact of using the flexible membrane directly as a stamp thus makes it possible to avoid the use of this intermediate stamp. This manufacturing process is thus simpler.

It should be noted that, in order to simplify the known manufacturing processes, the inventors have made use of the fact that the membrane is, in the specific case of the component manufactured here, flexible and made of polymer. Furthermore, using a flexible membrane as a stamp is not ordinary, as the membrane generally has much greater dimensions than the dimensions of the intermediate stamps used to date. Thus, the stamping processes where the stamp is moved, manually or by a robot, cannot be used. This is because, since the membrane often has a much greater surface area than that of the known stamps, the least error in alignment between the membrane and the external face of the composite film is reflected by an uncontrolled variation in the thickness of the composite film. In point of fact, the alignment required cannot be achieved by moving, manually or using an automated arm, the membrane with respect to the external face of the composite film. Thus, in the above process, another method is provided for pushing the membrane against the composite film. This other method operates even if the surface area of the membrane is very large. In this instance, a very large surface area is a surface area of greater than 50 cm$^2$ or 100 cm$^2$. The above process operates even if the surface area of the membrane is greater than 0.3 m$^2$ or 1 m$^2$. This is because, by compressing the membrane against the external face of the composite film using a fluid, it is guaranteed that the pressure exerted at all points of its surface is uniform.

The embodiments of this manufacturing process on a flexible membrane can comprise one or more of the characteristics of the dependent claims.

These embodiments of the manufacturing process on a flexible membrane in addition exhibit the following advantage:
The fact that the face of the rigid substrate is smooth makes it possible in addition to reduce the roughness of the external face of the composite film transferred onto the flexible membrane.

Another subject-matter of the invention is a process for the manufacture, on a rigid substrate made of a material other than a polymer, of a component comprising a composite film. This manufacturing process also uses the claimed manufacturing process.

The above manufacturing process makes it possible to simply and efficiently remove a portion of a composite film. It should be remembered, on that subject, that composite films are difficult to etch according to conventional wet or dry etching processes. This is because, given that composite films comprise at least two different materials, that is to say the matrix made of thermoplastic polymer and the material of the particles, it is difficult, indeed even impossible, to find a product which dissolves, with the same effectiveness, both the matrix and the particles. Because of this difference in effectiveness, the etching of the composite film is non-uniform, which results in irregular cut edges. Conversely, the above process is simpler and in addition makes it possible to obtain cleaner cut edges.

The embodiments of this manufacturing process on a rigid substrate can comprise one or more of the characteristics of the dependent claims.

These embodiments of the manufacturing process on a rigid substrate in addition exhibit the following advantages:
Using a stamp, the face of which is smooth, makes it possible both to remove a portion of the composite film deposited on the rigid substrate while decreasing the roughness of the portions of the composite film which remain attached to this rigid substrate.
Using a stamp which comprises etched patterns in its front face makes it possible both to remove a portion of the composite film deposited on the rigid substrate while structuring the external face of the portions of the composite film which remain attached to this rigid substrate.

A better understanding of the invention will be obtained on reading the description which will follow, given solely as a non-limiting example and made with reference to the drawings, in which:

FIG. 1 is a diagrammatic illustration, in vertical cross section, of a composite film portion deposited on a rigid substrate, FIG. 2 is a diagrammatic illustration, in vertical cross section, of another composite film portion transferred onto a flexible membrane;

FIG. 3 is a diagrammatic illustration, in vertical cross section, of a device used to manufacture the structures of FIGS. 1 and 2;

FIG. 4 is a flow diagram of a transfer process used to manufacture the structures of FIGS. 1 and 2;

FIGS. 5 and 6 are diagrammatic illustrations, in vertical cross section, of the device of FIG. 3 in different operating positions;

In these figures, the same references are used to denote the same elements. In the continuation of this description, the characteristics and roles well known to a person skilled in the art are not described in detail.

Figure 7:
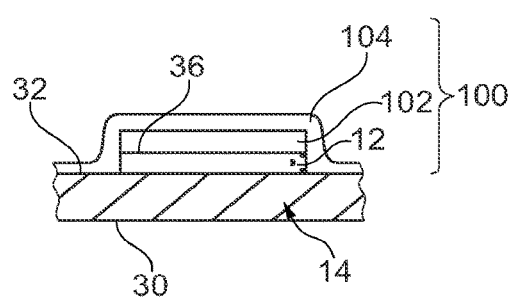
FIG. 7 is a diagrammatic illustration, in vertical cross section, of a component manufactured on a flexible membrane.

In this description, first the transfer of a composite film onto a flexible membrane is described. Subsequently, processes for the manufacture of a component using such a transfer are described.

FIG. 1 represents a stack 2 of a portion 4 of a composite film 8 deposited on a rigid substrate 6. This stack 2 is obtained by employing the transfer process of FIG. 4.

FIG. 2 represents a stack 10 of another portion 12 of the same composite film 8 on a flexible membrane 14. This stack 10 is also obtained from the transfer process of FIG. 4.

Subsequently, the terms "upper", "lower", "above", "below", "top" and "bottom" are defined with respect to the stack directions, that is to say the directions perpendicular to the planes in which, respectively, the membrane 14 and the substrate 6 mainly extend. In this instance, these stack directions are vertical.

The substrate 6 extends mainly in a horizontal plane. The substrate 6 is made of a material which is not a polymer. Typically, the substrate 6 is also made of an inorganic material. The term "inorganic material" denotes in this instance a material devoid of carbon, that is to say a material comprising less than 1% by weight and preferably less than 0.1% by weight of carbon. Typically, the substrate 6 is a mineral substrate, such as a monocrystalline mineral substrate or a ceramic mineral substrate. For example, the material of the substrate 6 is chosen from the group consisting of silicon, glass, silica, alumina and metal oxides or from the group consisting of the following ceramics: PZT and AlN. The metal oxide is, for example, MgO.

In this instance, the substrate 6 is a silicon substrate, the upper face 20 of which is composed of a layer of silicon oxide with a thickness of 500 nm.

The thickness of the substrate 6 is greater than the thickness of the film 8 and generally greater than 10 μm or 20 μm. Its Young's modulus at 20° C. is generally greater than 100 GPa. Furthermore, if the material of the substrate 6 exhibits a glass transition temperature, then the latter is greater by at least 50° C. and preferably more than two or three times greater than that of the matrix of the composite film 8. Likewise, if the material of the substrate 6 exhibits a melting point, the latter is very high, that is to say greater than 200° C. or 350° C.

The substrate 6 exhibits an upper face 20 directly in mechanical contact with a lower face of the portion 4 of the film 8. In this instance, this face 20 is flat and horizontal. In this instance, the face 20 is hydrophilic in order to facilitate the adhesion of the film 8 to this face. Preferably, the face 20 is also smooth in order to facilitate the deposition of the film 8.

In this description, the term "smooth" denotes a face of a layer or of a substrate, the RMS (Root Mean Square) roughness of which is at least less than 20% or 25% of the thickness of the layer or of the substrate. Preferably, the RMS roughness is less than the mean exodiameter of the nanoparticles of the film 8 and typically two or three or ten times less than this mean exodiameter. Generally, the roughness of a smooth face is thus less than 1 μm and more advantageously still less than 100 nm or 50 nm or 10 nm. The RMS roughness is measured over a surface area of 100 μm$^2$ or of 1 μm$^2$ using an Atomic Force Microscope (AFM) or a profilometer, according to the height of the unevennesses to be measured. Whatever the roughness of the face, this is created solely by unevennesses randomly distributed over the whole of this face. In other words, the face is not structured. In this description, the term "structured face" denotes, in this instance, the fact that patterns, such as grooves or holes, are etched into this face at predetermined locations. The depth of these patterns is greater than 10 nm or 50 nm and typically greater than 1 μm or 20 μm.

In this embodiment, the portion 4 of the film 8 covers solely a portion of the face 20. For example, the portion 4 covers less than 90% and generally less than 70% or 50% of the surface of the face 20. The portion 4 is directly deposited on the face 20.

The thickness of the film 8 is typically between 100 nm and 10 μm and preferably between 100 nm and 3 μm. In this instance, the thickness of the film 8 is equal to 2 μm to within plus or minus 20%.

The film 8 comprises a matrix 22 made of thermoplastic polymer inside which are dispersed nanoparticles 24. In order to simplify FIG. 1, the reference 24 is shown only for a few of the nanoparticles, represented by black points.

The matrix 22 fills the interstices between the nanoparticles 24 in order to mechanically bind them together. This matrix 22 is made of a thermoplastic polymer which exhibits a glass transition temperature $T_g$. For example, the temperature $T_g$ is greater than or equal to 30° C. or 50° C. The temperature of the matrix 22 is measured according to the method described in the following document: "Standard Test Method for Assignment of the Glass Transition Temperatures by Differential Scanning calorimetry or Differential Thermal Analysis" (ASTM E 1356-98).

In this description, the term "polymer" denotes a polymer, the molar mass of which exceeds 1.5 kg/mol and generally 2 kg/mol; below, it is an oligomer. An "organic polymer" is a polymer produced from monomers composed of atoms used in organic chemistry, including at least carbon and often also one of the following atoms: H, O and N. For example, the chemical formulae of these monomers have the following form: (—R1R2C—CR3R4-) or (—R1C═CR2-) or (—C≡C—), where R1, R2, R3 and R4 are organic or non-organic groups. An inorganic polymer is a polymer prepared from monomers composed of atoms other than carbon. For example, the chemical formula of these monomers is as follows: (—R1R2X1-X2R3R4-), where X1 and X2 are not carbon. X1 and X2 may or may not be identical. For example, X1 and/or X2 are silicon atoms.

The matrix 22 is in this instance made of a thermoplastic organic polymer. For example, the matrix is made of PS (polystyrene) or PMMA (poly(methyl methacrylate)).

Generally, the matrix 22 is an electrically insulating or very weakly conducting and non-magnetic material. The term "electrically insulating" denotes in this instance a material, the electrical resistivity of which at 20° C. is greater than $10^6$ Ω·m or $10^8$ Ω·m or $10^{10}$ Ω·m. The term "non-magnetic" denotes in this instance a material devoid of a measurable magnetic property.

In this instance, the matrix 22 is made of polystyrene.

The nanoparticles 24 confer physical properties on the film 8. In the absence of these nanoparticles, the film 8 would be devoid of these physical properties and the component which incorporates a portion of this film thus would not function. The physical properties in question are typically magnetic, optical, electrical or thermal properties.

In this embodiment, the nanoparticles 24 are particles, the exodiameter of which is greater than 1 nm and preferably greater than 5 nm or 10 nm. The notion of exodiameter is well known in particle size analysis. It is simply restated here that the "Feret diameter" (Df) is the smallest distance between a first given straight line D1 and a second straight line D2 parallel to the straight line D1. These straight lines D1 and D2 are positioned so that all of the orthogonal projection of the particle in the plane containing these two parallel straight lines is between these two parallel straight lines. Furthermore, these two straight lines D1 and D2 each touch, at at least one point, the periphery of this orthogonal projection of the particle. If the straight line D1 is rotated all around the particle, a position of the straight line D1 is found for which the diameter Df is at a maximum. The maximum value of the diameter Df is the exodiameter. The minimum value of the diameter Df is the mesodiameter. The ratio of the maximum surface area of the projection of the particle to the surface area of the circle having a diameter equal to the exodiameter defines what is known as the shape index of the particle. The maximum surface area of the projection of the particle is the surface area of the orthogonal projection of the particle onto a plane, this plane being that which maximizes this surface area.

The exodiameter of the nanoparticles is also strictly less than the thickness of the film 8 and, preferably, at least two or three times less than the thickness of the film 8. Typically, the exodiameter of the nanoparticles is less than 1 µm and generally less than 150 nm. The shape index of the nanoparticles 24 is, for example, between 0.5 and 1.5 and often between 0.8 and 1.2. In this instance, the exodiameter of the nanoparticles 24 is between 20 and 50 nm and, for example, between 30 and 50 nm.

The nanoparticles 24 represent more than 1% and typically more than 10% and advantageously more than 20% or 30% or 50% of the volume of the film 8. The percentage by volume of the nanoparticles 24 in the film 8 can even exceed 90%, depending on the applications envisaged.

In this example, all the nanoparticles 24 are made of the same material. This material is different from that of the matrix 22 in order to confer the desired physical properties on the film 8. For example, the nanoparticles 24 are in this instance made of cobalt in order to confer magnetic properties on the film 8. In this case, the nanoparticles 24 are harder than the matrix 22.

The film 8 exhibits a flat upper face 26 turned towards the top.

In FIG. 2, the membrane 14 extends essentially in a horizontal plane. It exhibits a rear face 30 and, on the opposite side, a front face 32 parallel to this rear face 30. The membrane 14 is flexible. The term "flexible" denotes in this instance the fact that it is capable, in the absence of any element deposited on or attached to its faces, of uniformly deforming when its rear face is compressed by a fluid. For this, typically, its thickness is less than 1 mm and advantageously less than 500 µm or 100 µm. It is made of a polymer capable of deforming, at least in flexion, around anchoring points located on its periphery. Typically, the Young's modulus at 25° C. of the polymer of the membrane 14 is less than 3 GPa or 1 GPa and preferably less than 0.5 GPa. In this instance, it is made of a thermoplastic polymer and more specifically a thermoplastic organic polymer. Advantageously, this polymer is also an elastomer. Typically, the polymer is chosen from the group consisting of PC (polycarbonate), PP (polypropylene), PE (polyethylene), PMMA (poly(methyl methacrylate)), PVC (polyvinyl chloride) and PVDF (polyvinylidene fluoride). On the other hand, the membrane 14 is not made of PDMS (polydimethylsiloxane).

The surface area of the face 32 is in this instance greater than 20 cm$^2$ or 50 cm$^2$ and typically greater than or equal to 100 cm$^2$ or 500 cm$^2$. The surface area of the rear face 30 is equal to the surface area of the face 32.

The face 32 does not need to be smooth. For example, it generally exhibits a roughness greater than the mean exodiameter of the nanoparticles 24 and typically two or three or ten times greater than this mean exodiameter of the nanoparticles 24. The roughness of the face 32 is created solely by unevennesses randomly distributed over the whole of this face. In other words, the face 32 is not structured and does not comprise a pattern, for example a regular pattern, etched into this face 32.

The portion 12 of the composite film 8 exhibits an external face 36 turned the opposite way from the membrane 14. This face 36 is smooth. In this instance, its roughness is equal to that of the face 20 of the substrate 6.

FIG. 3 represents the architecture of a device 38 for transferring the portion 12 of the film 8 from the substrate 6 to the membrane 14. This device 38 is structurally similar to those described in Application US2003/0159608. Consequently, only the differences between the device 38 and the devices described in this Application US2003/0159608 are described in detail.

The device 38 comprises a reservoir 40 delimiting an internal cavity 41 capable of containing a compressed fluid. In this instance, the fluid is a gas, such as air. The interior of the cavity 41 is connected fluidically via a pipe 42 to a compressor 44.

The reservoir 40 comprises rigid vertical walls 46, the lower edges of which delimit an opening 47.

The device 38 also comprises a flexible membrane 14 which is mechanically independent of the reservoir 40.

The membrane 14 can be moved, reversibly, between a dismantled position (represented in FIG. 3) and an assembled position (represented in FIG. 5). In the dismantled position, the membrane 14 is mechanically separated from the lower edges of the walls 46, so that it does not close up the opening 47 in a leaktight fashion. In the assembled position, the membrane 14 closes up the opening 47 in a way which is leaktight to the compressed fluid. More specifically, when the membrane 14 is in its assembled position, a central section of its rear face 30 is directly flush with the inside of the cavity 41. Typically, the central section of the face 30 represents more than 50% and advantageously more than 90% of the surface area of the face 30.

The membrane can also be moved, reversibly, between a retracted position and an active position. In the retracted position, a zone 32A of the front face 32 is separated by a clearance from the face 26. This zone 32A is thus directly exposed to the exterior. In its active position, the zone 32A is directly in contact on the external face 26 of the film 8. In the retracted position, the shortest distance which separates the front face 32 from the upper face 20 of the substrate 6 is thus much greater than the distance which separates the faces 20 and 32 in the active position.

In FIG. 3, in order to simplify, in the position both retracted and dismantled, the membrane 14 is represented as being located under the opening 47. However, in practice, in the position both retracted and dismantled, the membrane is not generally located under the opening 47 but most often to the side thereof.

The device 38 comprises, facing the opening 47, a flat support 54. The support 54 exhibits a receiving face 56 turned towards the opening 47 and on which is deposited a stack of the film 8 on the substrate 6. Preferably, this stack is assembled, without any degree of freedom, on the face 56 when the membrane 14 is in its retracted position and is then dismantled after the use of the device 38.

In this embodiment, in the assembled position, the whole of the periphery of the membrane 14 is wedged between the lower edges of the reservoir 40 and the upper face 56 of the flat support 54. Thus, in this instance, in order to pass between the dismantled and assembled positions, it is the whole of the support 54 which moves in vertical translation between a bottom position (represented in FIG. 2) and a top position (represented in FIG. 5). In the bottom position, the clearance which separates the face 56 from the opening 47 is sufficiently great to allow the introduction and, alternatively, the withdrawal of the stack of the film 8 and of the substrate 6 between this face 56 and the opening 47. In the top position, the face 56 compresses the periphery of the membrane 14 onto the edges of the opening 47 in order to close up this opening in a way which is leaktight to the compressed fluid. When the support 54 is in its top position and when the stack of the film 8 and of the substrate 6 is present on the face 56, the membrane 14 is in its assembled position and, simultaneously, in its active position.

In FIG. 3, the portion 12 of the film 8 has not yet been transferred onto the front face 32 of the membrane 14.

In this embodiment, the device 38 comprises a stamp 48 attached to a zone 50 of the front face 32. The zone 50 is completely covered with the stamp 48 and is thus not directly exposed to the exterior. Conversely, the stamp 48 does not extend beyond the zone 50 and in particular does not cover the zone 32A.

The stamp 48 comprises a front face 52 and a rear face. This front face 52 and this rear face are parallel and each located on an opposite side. In this embodiment, the rear face is completely and directly in contact with and adhesively bonded, without any degree of freedom, to the zone 50. Only the front face 52 is intended to come directly into contact with the face 26 of the film 8 during the execution of the process of FIG. 4. In this instance, the face 52 is smooth. The zone 32A is not smooth.

The adhesive force of the face 52 on the face 26 is strictly less than and preferably at least two or three times less than the adhesive force of the film 8 on the substrate 6. This makes it possible not to tear off the portion of the film 8 on which the stamp 48 rests, as is explained with reference to the process of FIG. 4. To this end, the stamp 48 is made of an inorganic material which is not a polymer. Typically, the material used for the stamp 48 is chosen as described above for the substrate 6. In this instance, the material chosen is a mineral material. For example, the stamp 48 is made of silicon. Its thickness is then greater than 50 µm, for example greater than 500 µm or 750 µm.

The device 38 comprises a heating element 58 capable of heating the film 8 above the temperature $T_g$. In this instance, the heating element 58 is housed, by way of example, inside the support 54 and under the face 56.

The transfer of the portion 12 of the film 8 from the substrate 6 to the membrane 14 will now be described with reference to the process of FIG. 4 and using FIGS. 5 to 6.

The transfer process begins with the deposition 72 of the film 8 on the face 20 of the substrate 6. For this, a liquid solution is prepared which contains the matrix 22 and the nanoparticles 24 in a known proportion by volume which will result in the proportion by volume desired for the preparation of the film 8. For example, a solution is prepared which is composed mainly of the nanoparticles 24, of the thermoplastic polymer of the matrix 22 and of a solvent in which the thermoplastic polymer is dissolved.

Subsequently, in order to deposit the film 8 on the substrate 6, the colloidal solution is distributed over the whole of the upper face 20 of the substrate 6. Typically, this is carried out by centrifugal coating, better known as spin coating.

After drying, the film 8 deposited on the substrate 6 is obtained. At this stage, the film 8 comprises both the portions 4 and 12. For example, the film 8 extends over the whole of the face 20. Furthermore, the external face 26 of the film 8 exhibits numerous flatness defects and a high roughness. Typically, at this stage, the RMS roughness of the film 8 is greater than five or ten times the mean exodiameter of the nanoparticles 24. It appears that this high roughness is caused by clusters of nanoparticles 24 which agglomerate with one another during the preparation of the film 8. Furthermore, the flatness defects of the film 8 are also due to variations in thickness of this film. At this stage of manufacture, differences in thickness of the film 8 between two different locations have been measured which can reach and exceed 0.5 µm or 1 µm, indeed even 2 µm.

Subsequently, during a stage 74, the stack of the film 8 on the substrate 6 prepared above is placed on the face 56 of the support 54 facing the opening 47. Subsequently, the stamp 48 is deposited on the portion 4 of the film 8. At the same time or after, the membrane 14 is deposited on the face 26 of the film 8. The zone 32A then rests directly on the portions 12 of the film 8. The membrane 14 is then in its active position. At this stage, the membrane 14 and the stamp 48 are held on the face 26 solely by gravity. The support 54 is in its bottom position, so that the membrane 14 is in its dismantled position and the pressure inside the cavity 41 is equal to atmospheric pressure. Likewise, at this stage, the temperature of the film 8 is equal to the ambient temperature, that is to say less than 25° C. and less than the temperature $T_g$.

During a stage 76, the membrane 14 is moved from its dismantled position to its assembled position. For this, the support 54 is moved from its bottom position up to its top position.

Once the membrane is both in the assembled position and in the active position, during a stage 78, the compressor 44 compresses the fluid present inside the cavity 41 in order to reach a pressure strictly greater than atmospheric pressure. In this instance, it compresses the gas, for example, to 6 bar (0.6 MPa). The membrane 14 then deforms and fully matches the shape of the film 8 (FIG. 5). In FIG. 5, the vertical arrows inside the cavity 41 represent the pressure which is exerted on the rear face 30 of the membrane 14 and thus on the external face 26. This pressure is uniformly distributed over the whole of the face 26, this being the case whatever its surface area, as it is exerted via a fluid.

During a stage 80, the heating element 58 is controlled in order to heat the film 8 above the temperature $T_g$, while remaining below its melting point. The heating temperature also remains lower than the glass transition temperature of the substrate 6. In response to this heating, the film 8 softens. For example, the heating temperature is taken equal to 120° C. and is maintained for 1 min. The softening of the film 8 increases the adhesive force of the film 8 on the polymers and, at the same time, decreases its adhesive force on the materials which are not polymers. Thus, the softening of the film 8 increases its adhesion to the zone 32A and decreases its adhesion to the substrate 6 and the stamp 48.

During a stage 82, once the film 8 is softened, the compressor 44 increases the pressure of the fluid present inside the cavity 41 while maintaining the film 8 above its temperature $T_g$. For example, during stage 82, the pressure inside the cavity 41 changes to 40 bar (4 MPa). This pressure is maintained for 5 min. Thus, during stage 82, the zone 32A of the membrane 14 adheres strongly to the facing portion of the film 8. This facing portion is that intended to become the portion 12 of the film 8 after its transfer onto the membrane 14. At the same time, the face 52 strongly flattens the portion facing the film 8. However, the film 8 does not adhere to the face 52 as this face is made of a material which is not a polymer. The portion of the film 8 facing the stamp 48 is that which will become the portion 4 after the transfer.

During a stage 84, the heating element 58 is controlled in order to bring the temperature of the film 8 back below the temperature $T_g$. For example, the heating element 58 is switched off. Consequently, the film 8 hardens again as soon as its temperature falls back below the temperature $T_g$.

During a stage 86, once the temperature of the film 8 has fallen back below the temperature $T_g$, the compressor 44 brings the pressure inside the cavity 41 back down until it has returned to atmospheric pressure.

During a stage 88, once the pressure of the fluid inside the cavity 41 has again become equal to atmospheric pressure, the membrane 14 is moved to its dismantled position by moving the support 54 from its top position down to its bottom position.

Subsequently, during stage 90, the membrane 14 is moved from its active position to its retracted position. For example, a corner of the periphery of the membrane 14 is gripped and then pulled upwards until the membrane 14 is completely detached from the substrate 6. Doing this is frequently referred to as "peeling" the membrane 14. The portion 12 of the film 8 adhesively bonded to the zone 32A is then torn off the substrate 6 (FIG. 6). At the same time, the face 52 is separated from the face 26 of the film 8. Thus, only the portion 4 of the film 8 remains attached to the substrate 6. On conclusion of stage 88, the stack 2, on the one hand, and the stack 10, on the other hand, are thus simultaneously obtained. At this stage, the roughness of the face 36 of the film 8 of the stack 10 is equal to that of the face 20 to within plus or minus 10% or 5%. For example, the roughness of the face 36 is less than or equal to 100 nm or 50 nm. Subsequently, generally, the stamp 48 is withdrawn or removed, for example by detaching it by wet or dry etching. The stamp 48 can also be dissolved by wet or dry etching.

Subsequently, during a stage 92, the stack 2 is withdrawn from the support 54 and can be subjected to other treatments. At this stage, the flatness of the face 26 of the film 8 of the stack 2 is considerably improved. This is because the roughness of the face 26 is now equal to that of the face 52 to within plus or minus 10% or 5%. For example, the roughness of the face 26 is less than or equal to 100 nm or 50 nm.

FIG. 7 represents a component 100 manufactured on and attached to the face 32 of the membrane 14. This component 100 is a component which captures or which modifies or which emits a physical signal, such as an electromagnetic, optical or electrical signal. The component 100 can also treat several of these signals. The continuation of this description is done in the specific case where the component 100 is a component which converts an electromagnetic signal into an electrical signal.

Only the characteristics of the component 100 relevant for the description of its process of manufacture are described. Thus, its graphical representation has been extremely simplified and the factors of scale have not been respected in FIG. 7. This comment also applies to FIGS. 9 and 11.

The component 100 comprises, successively stacked one above the other in the vertical direction and ranging from the bottom upwards:
the portion 12 of the film 8 transferred onto the face 32 of the membrane 14,
a functional layer 102 directly deposited on the portion 12 of the film 8, and
a passivation layer 104 deposited on the functional layer 102.

The functional layer 102 is necessary for the operation of the component 100 after its manufacture has been completed. It is deposited directly on the face 36. Its thickness is typically between 100 nm and 10 µm and preferably between 100 nm and 3 µm. In this instance, this functional layer 102 is structured in order to form a pattern, such as one or more strands of an inductor or of an antenna, on the face 36. Thus, in this embodiment, it does not cover the whole of the face 36. In this example, the functional layer 102 is a strand made of gold deposited on the portion 12 of the film 8.

The layer 104 is, for example directly, deposited on the functional layer 102 in order to passivate it, that is to say to prevent from reacting with external elements. For example, the layer 104 prevents the layer 102 from oxidizing. In the specific case described in this instance, the component is an antenna capable of emitting or of receiving electromagnetic waves via the strand made of gold.

Figure 8:
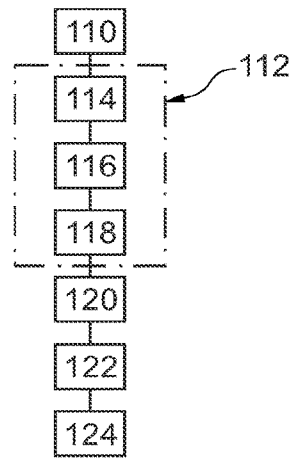
FIG. 8 is a flow diagram of a process of the manufacture of the component of FIG. 7.

FIG. 8 represents a process for the manufacture of the component 100. This process begins with a stage 110 of manufacture of the membrane 14.

During a phase 112, the portion 12 of the film 8 is then deposited on the membrane 14.

This phase 112 begins with a stage 114 of bringing the stamp 48 into contact with and adhesively bonding it to the zone 50.

Subsequently, during a stage 116, the membrane 14 is moved to its active position and then to its assembled position, as described with reference to the process of FIG. 4.

During a stage 118, the portion 12 of the film is then transferred onto the membrane 14, as described in the process of FIG. 4.

On completion of stage 90 of the process of FIG. 4, phase 112 is complete and the process is continued with:
the deposition, during a stage 120, of the functional layer 102 directly on the face 36 of the portion 12 of the film 8, then
the structuring, during a stage 122, of the deposited functional layer 102 in order to form the strand of the antenna, then
the deposition, during a stage 124, of the passivation layer 104 on the structured functional layer 102.

Stages 120 and 122 are carried out according to processes conventional in microtechnology for the deposition and structuring of layers. For example, the deposition is carried out by sputtering or electrodeposition. The structuring of the layer 102 is then carried out by dry or wet etching. Stages 120 and 122 can also be carried out using an inkjet printer, which projects the layer 102 solely at the desired locations on the face 36. In this case, the deposition and the structuring of the layer 102 take place at the same time.

Despite the use of a conventional process for the deposition of the functional layer 102, the latter adheres very well to the face 36 of the portion 12 of the film 8 as the flatness of this face is very good at that stage.

Figure 9:
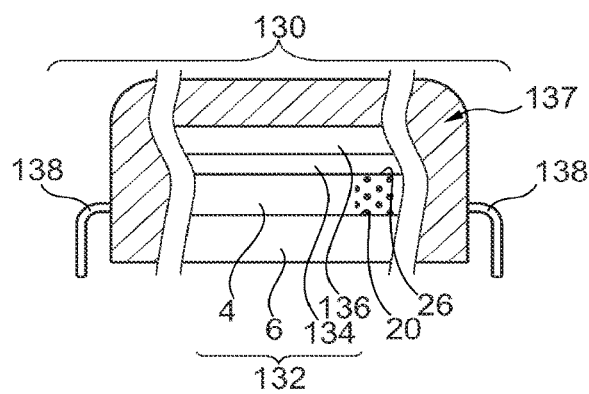
FIG. 9 is a diagrammatic illustration, in vertical cross section, of a component manufactured on a rigid substrate.

FIG. 9 represents a component 130 comprising the portion 4 of the film 8 deposited on the rigid substrate 6. The possible functionalities of the component 130 are identical to those described for the component 100. The continuation of this description is done in the specific case where the component 130 is capable of converting an electromagnetic signal into an electrical signal.

In FIG. 9, the vertical wavy lines indicate that portions of the component 130 have not been represented.

The component 130 comprises a stack 132. This stack 132 comprises, successively stacked one above the other in the vertical direction and ranging from the bottom upwards:
the rigid substrate 6,
the portion 4 of the film 8 directly deposited on the substrate 6,
a functional layer 134 directly deposited on the portion 4 of the film 8, and
a passivation layer 136 deposited on the functional layer 134.

In this instance, the layers 134 and 136 are, for example, the same as, respectively, the layers 102 and 104.

The stack 132 is mechanically isolated from the exterior of the component 130 by a protective casing 137 which covers the majority of the faces of the stack 132. In this instance, the casing 137 covers the upper face of the stack 132 and, optionally, also all the vertical walls of this stack 132. It is attached without any degree of freedom to the stack 132. For example, it is adhesively bonded to this stack 132.

This casing 137 is made of a material which does not interfere with the operation of the stack 132. In this instance, the casing 137 is made of a non-magnetic and electrically insulating material, such as, for example, an encapsulating resin (epoxy, silicone, varnish). Furthermore, in order to fulfil its protective role, the thickness of the casing 137 is generally fairly large, that is to say greater than or equal to 10 μm or 100 μm.

Finally, the component 130 generally needs to communicate or exchange energy with at least one item of equipment located outside the casing 137. To this end, it comprises bonding pads 138 via which it exchanges information and/or energy with this external item of equipment. These pads 138 are attached without any degree of freedom to the external face of the casing 137. For example, the pads 138 are flush with the external face of the casing 137 or project beyond this casing 137.

When the signal exchanged with the external item of equipment is an electrical signal, these pads 138 are made of an electrically conducting material. The term "electrically conducting" denotes in this instance a material, the electrical resistivity of which at 20° C. is less than $10^{-6}$ Ω·m or $1.5*10^{-8}$ Ω·m. When the signals exchanged are optical signals, the pads 138 are made of a material transparent to the wavelengths of the optical signals exchanged.

FIG. 9 represents the case where electrical signals are exchanged and the pads 138 are represented in the form of electrical pins. For example, one of these pads 138 is electrically connected to the strand made of gold formed by the layer 134.

The component 130 can comprise other stacks or electronic chips even within the protective casing 137. However, in order to simplify the illustration, these have not been represented.

Figure 10:
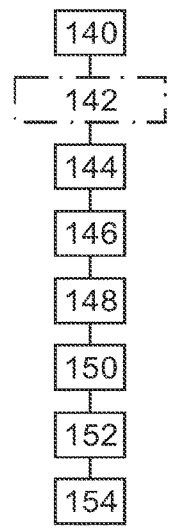
FIG. 10 is a flow diagram of a process for the manufacture of the component of FIG. 9.

FIG. 10 represents a process for the manufacture of the component 130. This process begins with a stage 140 of manufacture of the substrate 6.

During a phase 142, the composite film is deposited on the substrate 6 and then etched or partly removed. For this, the portion 12 of the film 8 is transferred onto the membrane 14 while leaving the portion 4 attached to the substrate 6. This phase 142 is in this instance identical to phase 112.

On conclusion of stage 92 of the process of FIG. 4, phase 142 is complete and the process is continued by:

the deposition, during a stage 144, of the functional layer 134 directly on the face 26 of the portion 4 of the film 8, then the structuring, during a stage 146, of the deposited functional layer 134 in order to form the strand of the antenna, then the deposition, during a stage 148, of the passivation layer 136 on the structured functional layer 134.

Stages 144 to 148 are carried out as described for stages 120 to 124. As in the case of the process of FIG. 8, despite the use of a conventional process for the deposition of the functional layer 136, the latter adheres very well to the face 26 of the portion 4 of the film 8 as the flatness of this face is very good at that stage.

Stage 148 can be followed by one or more phases 150 of producing other stacks, such as the stack 132, or one or more electronic chips.

Subsequently, the process is continued by a stage 152 of producing bonding pads 138 and of electrical connection of these pads. Finally, during a stage 154, the casing 137 is produced. For example, the casing 137 is produced by moulding a thermosetting polymer.

Figure 11:
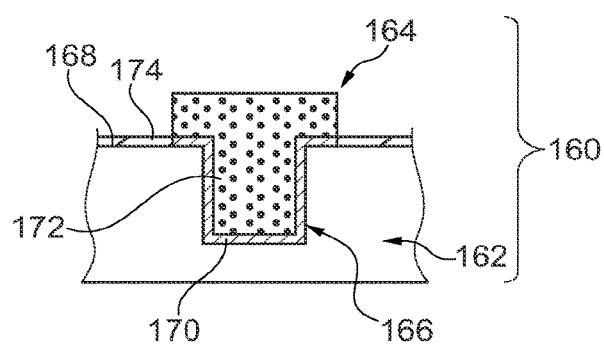
FIG. 11 is a partial diagrammatic illustration, in vertical cross section, of a portion of a component.

FIG. 11 represents a portion of a component 160 manufactured on a rigid substrate 162 which is not made of polymer and which comprises a portion 164 of a composite film. The substrate 162 is, for example, identical to the substrate 6, except that it comprises at least one cavity, and generally more than ten cavities, hollowed out in its front face 168. In this instance, in order to simplify FIG. 11, only one cavity 166 is represented. The other cavities are, for example, identical to the cavity 166.

The portion 164 is located immediately above the cavity 166 and completely obstructs the opening of this cavity in the face 168. To this end, the portion 164 juts over the face 168 all around the opening of the cavity 166.

In this instance, the cavity 166 is a blind hole comprising vertical walls and a horizontal bottom. The depth of the cavity 166 is strictly less than the thickness of the composite film used in the process of FIG. 12 before it is flattened by a stamp. For example, the depth of the cavity 166 is greater than 0.1 μm and generally less than 10 μm. The width of the cavity 166 is greater than 50 nm and generally less than 1 μm, if the cavity is produced by electron beam (e-beam) lithography. On the other hand, this width is greater than 1 μm and generally less than 100 μm if the cavity 166 is produced by photolithography (UV). Typically, the cavities are spaced out from one another by a distance greater than their width.

The vertical walls and the horizontal bottom of the cavity 166 are covered with an electrically conducting coating 170, such as a metal coating. Preferably, this coating 170 is also hydrophilic. For example, the coating is made of gold or of platinum. In this example, the coating 170 is made of platinum. The coating 170 also extends, between the portion 164 and the front face 168, over the whole of the periphery of the opening of the cavity 166. This extension of the coating 170 over the face 168 stops at the limit of the portion 164 of the composite film. A non-metal layer 174, for example made of silicon oxide, covers the remainder of the face 168 which is not located under a portion 164 of the composite film.

The interior of the cavity 166 is filled with a material 172 identical to that of the composite film. In this instance, the portion 164 and this material 172 form only a single block of substance.

The cavity 166 is in this instance functionalized, that is to say that it is capable of fulfilling other roles than simply an electrical connection between different elements of the component 160. These other roles are rendered possible by the filling material 172, which confers on it additional physical properties and thus this ability to fulfil other roles. These additional roles can be electrical, dielectric, magnetic or optical roles, indeed even piezoelectric or magnetostrictive or magnetoresistive roles.

The component 160 can also comprise:
a functional layer,
a passivation layer, and
if necessary, a protective casing and bonding pads.

These different elements are as described with reference to FIG. 9. In order to simplify FIG. 11, the functional layer, the passivation layer and the protective casing, and also the connections, have not been represented.

Figure 12:
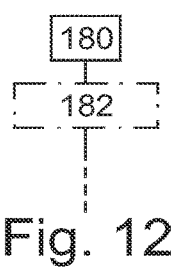
FIG. 12 is a flow diagram of a process for the manufacture of the component of FIG. 11.

The process for the manufacture of the component 160 will now be described with reference to the process of FIG. 12. This process starts with a stage 180 of manufacture of the substrate 162. This stage 180 is, for example, identical to stage 140, except that it additionally comprises the preparation of the layer 174, then the etching, in the face 168, of the cavity 166 and, finally, the deposition of the coating 170 inside the cavity 166.

Subsequently, during a phase 182, a film of the material 172 is deposited over the whole of the upper face of the substrate 162. This film is a composite film. Subsequently, it is structured or partially removed in order to leave remaining only the portion 164 of the composite film over the opening of each cavity 166. This phase 182 is identical to phase 112, except that use is made of a stamp which faces the opening of the cavity 166 and the front face of which does not jut out beyond the coating 170 during stage 82. In particular, during stage 72, the composite film deposited covers all the cavities 166. Preferably, during this stage 72, the vacuum between the deposited composite film and the face 168 is produced, for example by pumping. During stage 82, as above, the stamp flattens the face 26 of the composite film. However, in this instance, the pressure exerted by this stamp also brings about the complete filling of each cavity by the material of the composite film. This is because, during stage 82, the composite film is softened. Subsequently, during stage 88, the withdrawal of the membrane 14 brings about the tearing off of the portions of the composite film located all around the opening of the cavity 166. Only the portions of the composite film, such as the portion 164, remain integral with the substrate 162.

Subsequently, after phase 182, the process is continued, for example by the same manufacturing stages as those described with reference to the process of FIG. 10 after phase 142. In order to simplify FIG. 12, these following stages 144 to 154 have not been represented.

Many other embodiments are possible. For example, the upper face 20 of the substrate 6 is not necessarily smooth. In an alternative form, it is structured before depositing the film 8. Under these conditions, after the transfer of the portion 12 onto the membrane 14, the face 36 is itself also structured but with an inverted relief.

The substrate 6 can be made of other materials than silicon oxidized at the surface. For example, the substrate 6 is made of metal. In the latter case, preferably, it is covered with a hydrophilic non-organic coating. This hydrophilic coating can be a coating of metal oxide and nitride, of conducting or semiconducting oxide, or any metal preferably weakly oxidizable. It can, for example, be gold, platinum, silicon, silicon oxide, silicon nitride, aluminium nitride, ITO (indium tin oxide), AZO, and the like.

The film 8 can contain a mixture of different types of nanoparticles. These different types of nanoparticles differ from one another, for example, in their chemical composition. That which has been described for the nanoparticles 24 then applies to each of these types of nanoparticles.

In an alternative form, the adhesion of the membrane 14 to the film 8 is increased by covering at least the zone 32A with a hydrophilic organic coating. For example, the hydrophilic organic coating of the face 32 is produced from a hydrophilic polymer of metal hydroxides and of amines. For example, its general formula can be $M(OH)_x$ with M chosen from the group consisting of Be, Mg, Ca, Sr, In, Ba, Ra, Al, Zn, Y and polydopamines and index x is, typically, an integer greater or equal to one.

All the embodiments described in Application US2003/0159608 can be adapted to the process of FIG. 4. The adaptation then consists in replacing the membrane and the stamp described in this Application US2003/0159608 with the membrane 14 and the stamp 48 described above.

In an alternative form, the front face 52 of the stamp 48 is made of a hydrophobic material or is rendered hydrophobic by grafting, for example fluorinated chains, to this face. Typically, in this case, the whole of the face 52 is hydrophobic.

In another alternative form, the front face of the stamp 48 is structured. The fact of structuring the front face of the stamp makes it possible, during the compression of this stamp against the softened composite film, to additionally structure the face 26 of the portion 4 of the composite film which remains attached to the rigid substrate.

The stamp 48 is not necessarily adhesively bonded to the zone 50 of the membrane. In an alternative form, it is simply brought into non-adhesive contact with this zone 50. This facilitates the withdrawal of this stamp 48 from the membrane 14. For example, during stage 74, the stamp 48 is first deposited on the portion 4 of the film 8. Subsequently, the membrane 14 is moved to its active position. Consequently, the stamp 48 is interposed and wedged between the portion 4 of the film 8 and the membrane 14. Stages 76 to 88 are then carried out as described above. Finally, during stage 90, the movement of the membrane 14 to its retracted position results at the same time in its separation from the stamp 48. The stamp 48 is subsequently, in turn, withdrawn in order to separate it from the portion 4 of the film. For this, the stamp 48 is, for example, simply pulled upwards.

The stamp 48 can be omitted in all the processes described in this instance where a composite film has to be deposited on a polymer membrane. In this case, the zone 32A covers the whole of the front face 32. Consequently, the process of FIG. 4 results in the transfer of the whole of the film 8 onto the membrane 14.

In a specific embodiment, the pressure of the membrane 14 on the face 26 of the film 8 is obtained by creating a negative pressure between these two faces, instead of by increasing the pressure inside the cavity 41. In this embodiment, the fluid inside the cavity 41 is not compressed. In another alternative form of the device 38, the fluid used to push the membrane 14 is not a gas but a liquid.

For certain large-dimension applications, the surface area of the front face 32 can exceed 1 $m^2$ or 2 $m^2$. Everything which has been described above still applies.

Several different intermediate layers can be deposited between the functional layer 102 or 134 and the passivation layer 104 or 136. One or more of these intermediate layers can be composite films similar to the film 8. In this case, these additional composite films are deposited as described for the film 8.

The functional layer 102 or 134 can be any element necessary for the operation of the component. For example, the functional layer can be structured in order to form an electrical connection between different parts of the component.

In an alternative form, stage 122 or 146 of structuring the functional layer is omitted. In this case, the functional layer covers the whole of the face 26 or 36 of the composite film portions. This functional layer can also be made of many different materials chosen as a function of their physical property. For example, if the functional layer has to be made of a material which is a good conductor of electricity, it can then be made of metal. The functional layer can also be made of other materials having other properties, such as a piezoelectric material, an electrocaloric material or a ferromagnetic material. The functional layer can also be a composite film, that is to say it can comprise a matrix inside which are dispersed nanoparticles. For example, the functional layer is a composite film having nanoparticles different from those of the film 8.

The protective casing 137 can completely encase the stack 132, that is to say cover its upper and lower faces, and also its vertical walls. Depending on the role of the stack 132, the protective casing can be made of other materials. For example, it can be made of metal, if the operation of the stack 132 is possible inside such a protective casing made of metal. In a simplified alternative form, the casing 137 is omitted.

In some embodiments of the component 160, the coating 170 is omitted. It is also possible for the cavity 166 to traverse right through the substrate 162. In this case, the traversing cavity is better known under the term of "via". In another alternative form, the layer 174 also extends under the portion 164 between this portion and the face 168.

In another alternative form, after stage 90 or 92 or after another subsequent stage of manufacture of the component 100 or 130 or 160, the process comprises a stage of cutting the membrane 14 or the substrate 6 into several pieces mechanically independent of one another. Each of these pieces is then incorporated in a respective component mechanically independent of the others. It is then said that it is a collective process for the manufacture of these different stack pieces each comprising a composite film deposited on a membrane or a substrate.

Passing through an intermediate pressure before applying a higher pressure can be omitted. This is in particular the case if the final pressure used to flatten the face 26 is less than 10 bar (1 MPa). The pressure used to flatten the face 26 is strictly greater than 1 bar and generally greater than 6, 10 or 30 bar. It is also generally less than 500 bar.

It is also possible to begin to heat the film 8 before moving the membrane 14 into its active position.

During stage 80, the heating element 58 can heat the film 8 and the membrane 14 above their respective glass transition temperatures. The adhesive force between the composite film and the membrane is then improved by the fact that the membrane and the composite film are both softened.

The adhesive force of the composite film on the membrane can also be improved if:
covalent bonds between the composite film and the membrane are created during the transfer and, at the same time, no covalent bond is created between the composite film and the substrate.

The front face of the membrane can be structured in the zone 32A. This improves the adhesion of the composite film to this zone 32A of the membrane 14.

Stages 72 to 88 for transferring a composite film portion onto the membrane can be repeated several times in order to successively transfer several composite film portions onto the same membrane. This makes it possible in particular to produce, on the membrane 14, a stack of several composite films one above the other. For this, at each new iteration of stages 72 to 88, the zone 32A is coincident with the face 36 of the portion of the composite film transferred previously. In this stack, the composite films can be all identical to one another or, on the contrary, differ from one another, for example in the nature of their nanoparticles.

Optionally, during stage 72, the material 172 does not completely fill the cavities 166. This absence of complete filling of the cavities originates, for example, from the viscosity of the colloidal solution used during this stage.

The embodiments described until now have been described in the specific case of composite films comprising only nanoparticles. However, everything which has been described also applies to the composite films in which the particles dispersed inside the matrix have an exodiameter which can reach up to 10 μm or 30 μm or 100 μm. In this case, the thickness of the film is adapted in order for it to be strictly greater and preferably two or three times greater than the exodiameter of the largest particles of this film. When the exodiameter $ED_{max}$ of the largest particles exceeds 1 μm or 10 μm, it can be advantageous to keep the exodiameter of the smaller particles greater than $ED_{max}/100$ or $ED_{max}/10$ in order to limit the extent of the distribution of the exodiameters of the particles.

The invention claimed is:

1. Process for transfer of at least a portion of a composite film onto a flexible polymer membrane having a Young Modulus less than 3 GPa at 25° C., the composite film comprising a matrix made of thermoplastic polymer inside which are dispersed particles conferring physical properties on the composite film, an exodiameter of the particles being between 1 nm and 100 μm and a volume of the particles inside the composite film representing more than 1% of a volume of the composite film, the process comprising:
   α) deposition of the composite film directly on a rigid substrate made of a material other than a polymer and having a Young Modulus greater than 100 GPa at 20° C. a thickness strictly greater than a thickness of the composite film, the composite film then exhibiting an external face turned an opposite way from the rigid substrate, then
   β) transfer of at least a portion of the composite film deposited on the rigid substrate to the flexible polymer membrane by stamping using the flexible polymer membrane, wherein stage β) comprises the following operations:
   1) movement of the flexible polymer membrane both:
   into an assembled position in which a central portion of the flexible polymer membrane closes up, in a way leaktight to a fluid, an opening of a reservoir, the central section then exhibiting a rear face directly exposed to an inside of the reservoir and a front face on the opposite side, and
   into an active position in which a first zone of the front face is directly in contact on the external face of the composite film,
   2) heating of the composite film in order for its temperature to exceed a glass transition temperature of the matrix, so as to soften the composite film,
   3) when the composite film is softened and when the flexible polymer membrane is both in its assembled position and in its active position, the fluid inside the reservoir uniformly compresses the first zone against the external face of the composite film in order to adhesively bond the first zone to the external face with an adhesive force greater than the adhesive force which holds the composite film on the rigid substrate, then
   4) movement of the membrane from its active position to a retracted position in which the front face is further from the rigid substrate than in its active position, the movement of the membrane from its active position to its retracted position separating, from the rigid substrate, the portion of the composite film adhesively bonded to the first zone.

2. Process according to claim 1, in which, between operations 3) and 4), the process comprises cooling of the composite film below the glass transition temperature in order to again harden it, and operation 4) is carried out when the temperature of the composite film is lower than the glass transition temperature.

3. Process for manufacturing, on a flexible polymer membrane, a component comprising a composite film, the process comprising:
   a) deposition of at least a portion of a composite film on the membrane, and
   b) deposition of a functional layer on the external face of the said at least one portion of the composite film deposited on the membrane, the functional layer being necessary for the operation of the component, wherein
   stage a) comprises transfer of the said at least one portion of the composite film onto the membrane by employing a process in accordance with claim 1.

4. Process according to claim 3, in which, between stages a) and b), the process comprises dismantling of the membrane from the reservoir in order to carry out stage b) on the membrane detached from the reservoir.

5. Process according to claim 3, in which the face of the rigid substrate on which the composite film is deposited during stage α) of the transfer process is smooth such that the face exhibits solely unevennesses randomly distributed over the whole of its surface and with a dimension such that the RMS (Root Mean Square) roughness of the smooth face is less than the mean exodiameter of the particles dispersed in the composite film.

6. Process according to claim 5, the RMS roughness of the smooth face is less than 100 nm.

7. Process according to claim 6, wherein the RMS roughness of the smooth face is 50 nm.

8. Process according to claim 1, further comprising:
   providing a stamp made of a material other than a polymer and which is placed on the front face of the membrane, the stamp completely covering a second zone of the front face while leaving the first zone of the front face directly exposed to the outside and the front face of the stamp exhibiting an ability to adhere to the external face of the composite film which is lower than the adhesive force which holds the composite film on the rigid substrate; and
   during operation 3), providing the stamp interposed between the membrane and the external face of the composite film in order to prevent the second zone of the front face from adhesively bonding to the external face of the composite film, wherein during operation 4), the portion of the composite film facing the stamp remains attached to the rigid substrate.

9. Process according to claim 8, in which:
   before stage α), the process comprises preparation of a cavity in the face of the rigid substrate on which the composite film will be deposited, then
   during stage β), the stamp is positioned on the front face so as to be facing the cavity during operation 3).

10. Process for the manufacture, on a rigid substrate made of a material other than a polymer, of a component comprising a composite film, the process comprising:
   after said deposition of the composite film directly on the rigid substrate,
   b) removal of a first portion of the composite film deposited on the rigid substrate in order to render bare the face of the rigid substrate which is directly under the first portion, wherein
   stage b) is carried out by transferring the first portion of the composite film onto a flexible polymer membrane by employing a transfer process in accordance with claim 8 in which the first zone comes directly into contact over the whole of the first portion of the composite film and the stamp completely covers the portion or portions of the composite film which have to remain attached to the rigid substrate.

11. Process according to claim 10, wherein the stamp comprises patterns etched in its front face.

12. Process according to claim 10, wherein, after stage b), the process comprises a stage c) of deposition of a functional layer directly on the external face of the portion of the composite film which has remained attached to the rigid substrate, this functional layer being necessary for operation of the component.

13. Process according to claim 10, wherein the front face of the stamp is smooth so that the front face exhibits solely roughnesses randomly distributed over the whole of its surface and with a dimension such that the RMS (Root Mean Square) roughness of the smooth face is less than the mean exodiameter of the particles dispersed in the composite film.

14. Process according to claim 13, wherein the RMS roughness of the smooth face is less than 100 nm.

15. Process according to claim 14, wherein the RMS roughness of the smooth face is 50 nm.

* * * * *